United States Patent [19]

Vo et al.

[11] Patent Number: 5,328,859
[45] Date of Patent: Jul. 12, 1994

[54] METHOD OF MAKING HIGH VOLTAGE PNP BIPOLAR TRANSISTOR IN CMOS

[75] Inventors: Tuan A. Vo, Hawthorne; Mohamad M. Mojaradi, Los Angeles, both of Calif.

[73] Assignee: Xerox Corporation, Stamford, Conn.

[21] Appl. No.: 357

[22] Filed: Jan. 4, 1993

[51] Int. Cl.$^5$ .................... H01L 21/265; H01L 29/70
[52] U.S. Cl. ........................ 437/31; 437/74; 437/59; 148/DIG. 11; 257/339
[58] Field of Search .................... 437/31, 74; 148/DIG. 11; 257/339

[56] References Cited

U.S. PATENT DOCUMENTS 5,229,308  7/1993  Vo et al. .................... 437/31

FOREIGN PATENT DOCUMENTS 4342136  11/1992  Japan .................... 437/74
2129214   5/1984  United Kingdom .................... 437/31

Primary Examiner—Olik Chaudhuri
Assistant Examiner—Long Pham
Attorney, Agent, or Firm—Robert Cunha

[57] ABSTRACT

A high voltage bipolar transistor fabricated on a CMOS substrate without adding any additional process steps. During the CMOS n-well mask and implant steps an n-well is formed for the transistor. Next, during the CMOS field and deep boron implant steps a circular p-field is formed within the n-well. Finally, during the CMOS p+ mask and implant steps the p+ emitter is formed. The presence of the p-field between the emitter and n+ base provides high voltage protection.

2 Claims, 7 Drawing Sheets

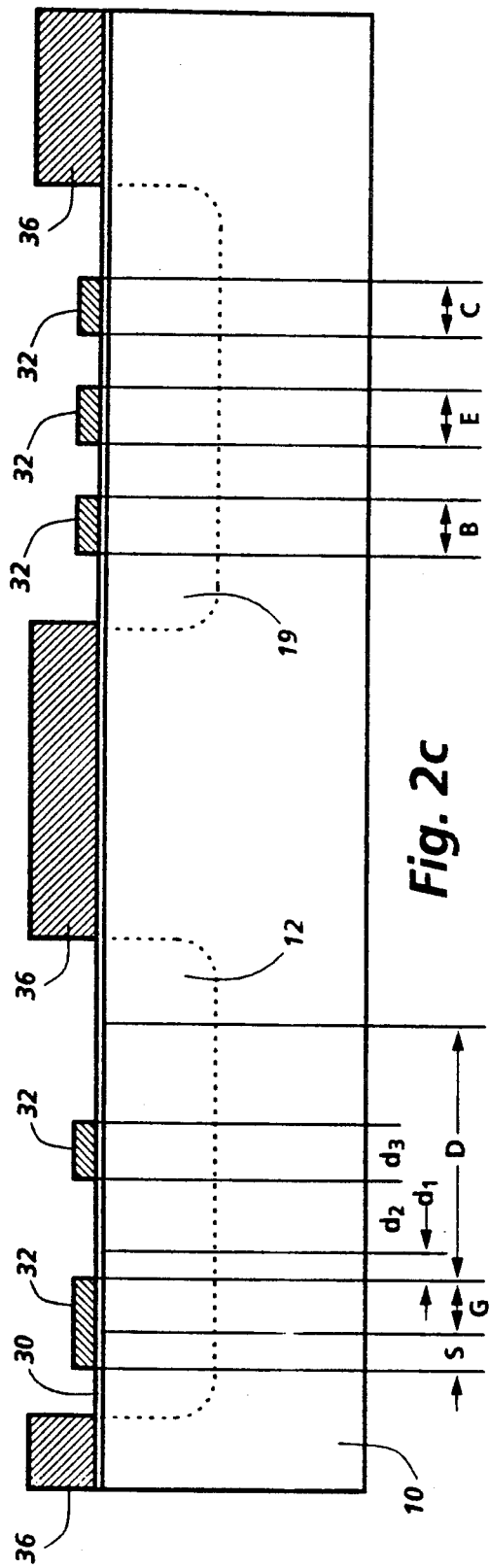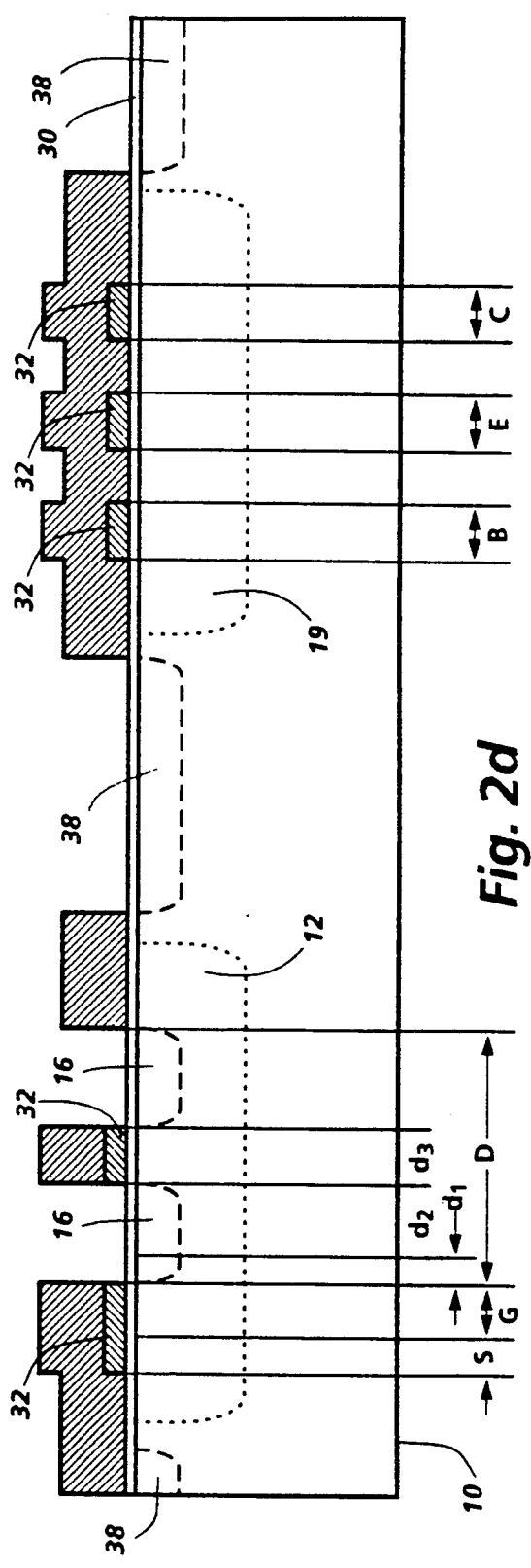

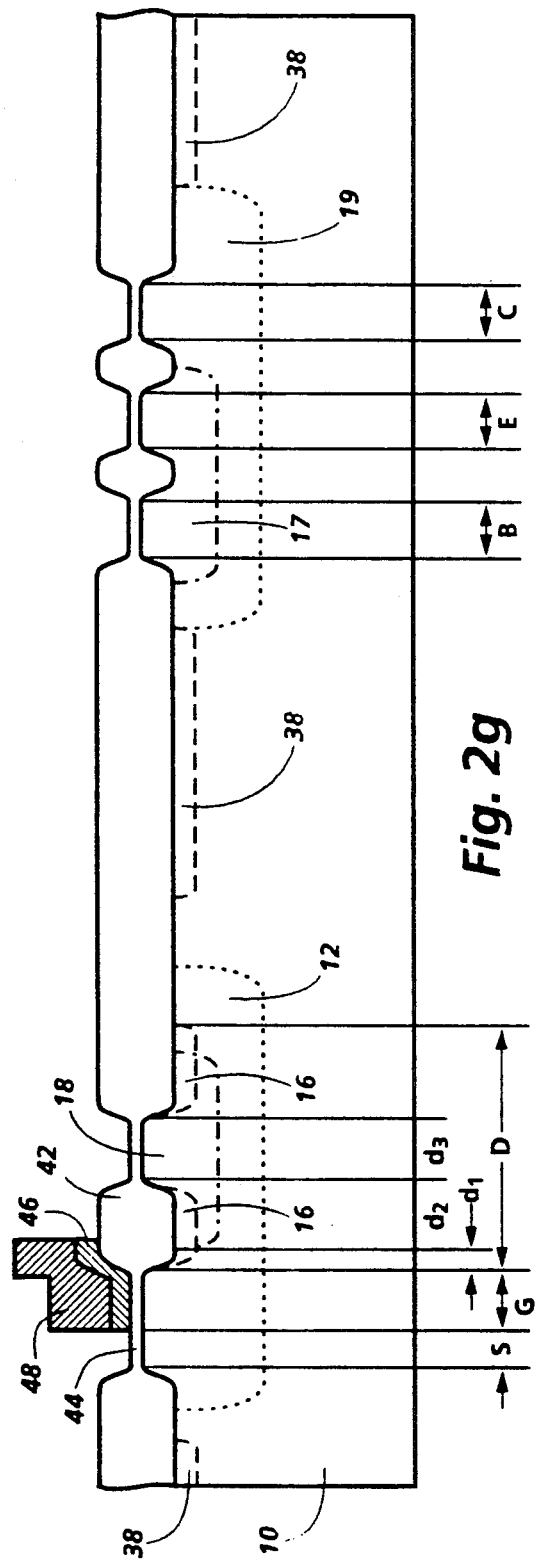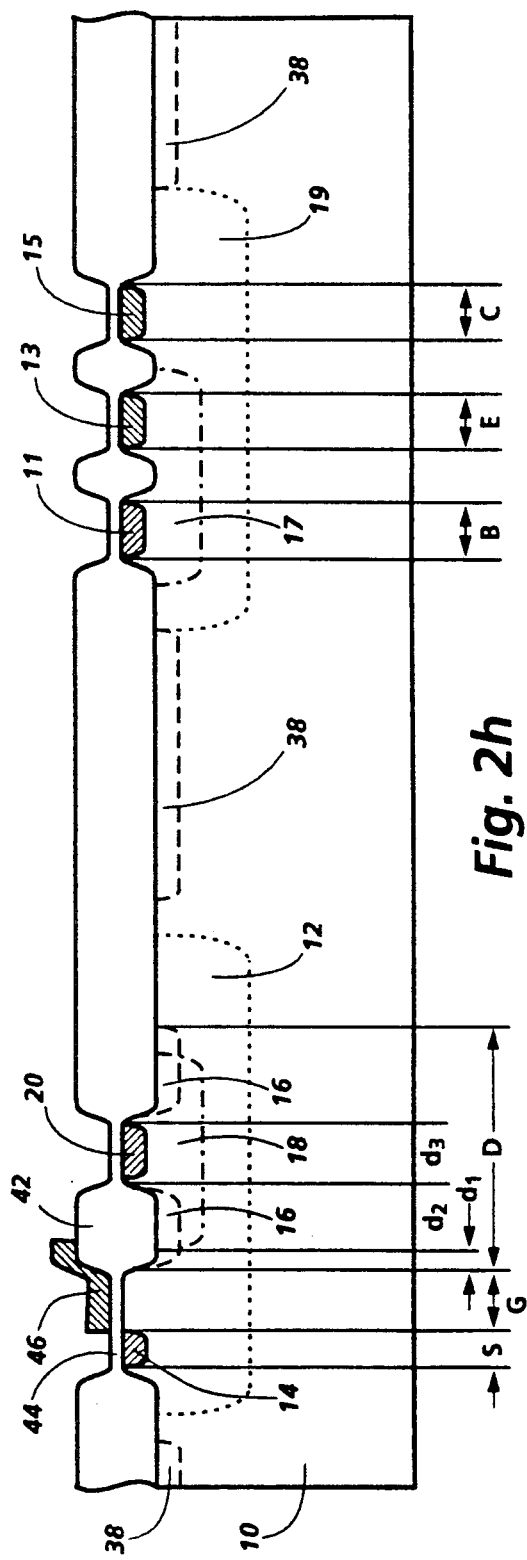

METHOD OF MAKING HIGH VOLTAGE PNP BIPOLAR TRANSISTOR IN CMOS

BACKGROUND OF THE INVENTION

The method of making a high voltage bipolar transistor during the process of fabricating a CMOS (complementary metal oxide silicon) circuit on an n-substrate.

Bipolar pnp and npn transistors and CMOS field effect transistors (FET's) are normally fabricated in separate processes. For example, vertical pnp transistors are commonly fabricated on a p substrate using the ordinary industrial CMOS process. However, all three types of transistors can be made in one process, BiMOS. A high voltage npn transistor and a high voltage annular PMOS FET with a triple diffused conductive drift region can also be made by adding additional steps to this BiMOS process. This process is described in commonly assigned Patent Application "Bipolar Transistors with High Voltage MOS Transistors in a Single Substrate", Ser. No. 07/878,141, is incorporated herein by reference, and is described in detail below. A result of the basic CMOS process is a vertical pnp bipolar transistor with a breakdown voltage of approximately 20 volts in the inverse direction. However, in some applications such as in the output protection circuit of a high voltage driver, a higher breakdown voltage is required. At the same time, it would be preferred that no additional process steps are required beyond those required by the basic process.

SUMMARY OF THE INVENTION

The bipolar transistor to be discussed is a pnp transistor with the emitter at the surface, the base being provided by a surrounding n-well, and the collector being the substrate. Under these conditions the electric field gradient is most concentrated at the bottom surface of the emitter, and that is the point where the breakdown is most likely to happen. To prevent this concentration, a p- layer drift region is implanted around the p+ emitter. The electric field is no longer concentrated around the relatively small p+ emitter, but is also spread over the much larger p- layer drift region. Therefore, breakdown is less likely, and the voltage tolerance is increased by an approximate factor of three. Finally, this additional drift region is produced without any added process steps.

BRIEF DESCRIPTION OF THE DRAWINGS

FIGS. 2a through 2j are a detailed description of the BiMOS process steps.

DETAILED DESCRIPTION OF THE INVENTION

Figure 1A:
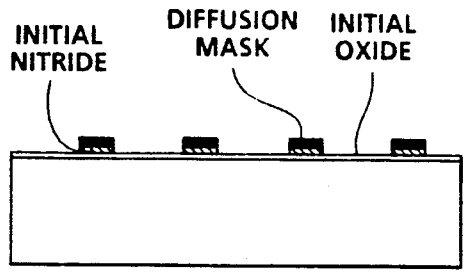
FIGS. 1a through 1g are a simplified set of drawings illustrating the fabrication steps required to produce this high voltage transistor.
Figure 1D:
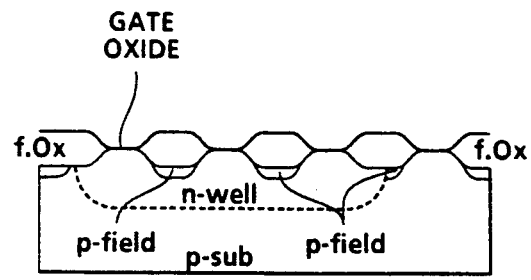
Figure 1B:
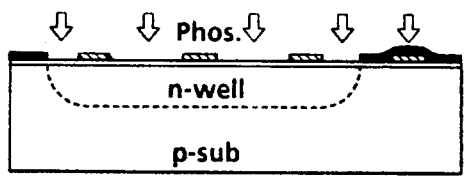
Figure 1E:
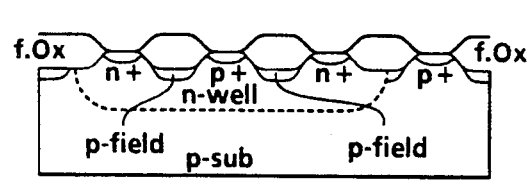
Figure 1C:
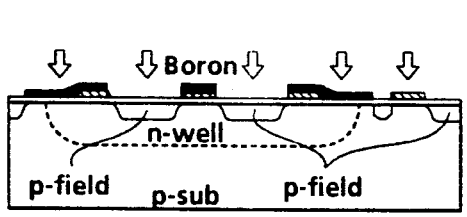
Figure 1F:
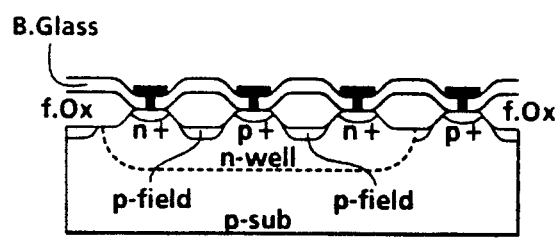
Figure 1G:
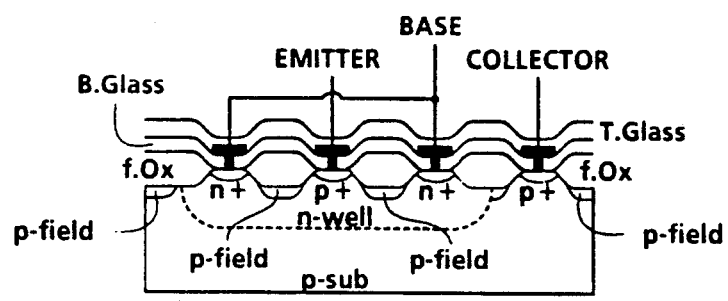

FIG. 1g shows a side view of the completed transistor. A normal bipolar transistor would have, as shown, a p+ emitter, an n- well base and a p- substrate collector. In this case, a normal working voltage would be up to a positive twenty volts applied to the emitter with respect to the substrate. However, if the load of this bipolar transistor was inductive, as in the situation described in co-pending patent application Ser. No. 08/000,359, entitled, "High Voltage Inytegrated Flyback Circuit in 2 UM CMOS", when the transistor is suddenly cut off, a voltage of as much as 60 volts may be applied to the emitter. As a result of this voltage, a large electric field would originate along a relatively large p- substrate area, but would be concentrated at the p+ emitter, which is the point at which the breakdown would occur. This invention provides the addition of p- drift field around the emitter. Now instead of being concentrated, the electric field would be dispersed over the entire emitter and drift regions, significantly increasing the amount of voltage this transistor can tolerate. Furthermore, this p- drift region is made by taking advantage of the p-field implant mask and without the use of any additional masking or process steps.

For a p-type substrate, a simplified description of the process to produce this device starts at FIG. 1a which shows the result of the initial oxidation, the application of the initial nitride diffusion mask, and the nitride etching process to create the four areas of nitride as shown.

FIG. 1b shows the application of an additional n- well mask and the n- well implanting of phosphorous to create the n-well.

FIG. 1c shows the addition of a field oxide mask and the field implant of boron to form the two p- field drift regions within the n- well and two other fields to the right of the n- well which are there for isolation. These steps, and the ones to follow with reference to FIGS. 1d, 1e and 1f are the regular steps in the process of fabricating both bipolar and CMOS devices, and will be discussed in more detail below. The only exception in this case to the general CMOS process is contained in this process step as shown in FIG. 1c. That is, normally, the bipolar n-well is masked off so that there will be no field implant of a p-field within the n-well. In this case, the mask is formed so that a p-field is allowed to form around the area that will later become the emitter.

FIG. 1d shows the result of the nitride etch, field oxidation, gate oxidation, poly deposition, poly mask and poly etch. The result is the growth of the field oxide and gate oxide as shown.

The process continues in FIG. 1e with the steps of the p+ source/drain mask, the p+ source/drain implant, the n+ source drain mask, the n+ source/drain implant, and the source/drain oxidation. The result of the n+ source/drain mask and implant steps is the creation of the two n+ areas which form the base connections.

The process continues in FIG. 1f with the deposition of the bottom glass passivation layer, the contact mask, the contact etch, metal deposition, metal mask and metal etch. This results in the attachment of metal connections to the emitter and base regions.

The end result is a bipolar transistor having a high voltage tolerance, created by using either the CMOS or a BiMOS process. As described above, not all of the process steps are used in the construction of the bipolar device. Furthermore, the CMOS process is a subset of the BiMOS process. The following description of the BiMOS process described in the incorporated Patent Application is included to provide a more detailed description of these process steps.

Figure 2A:
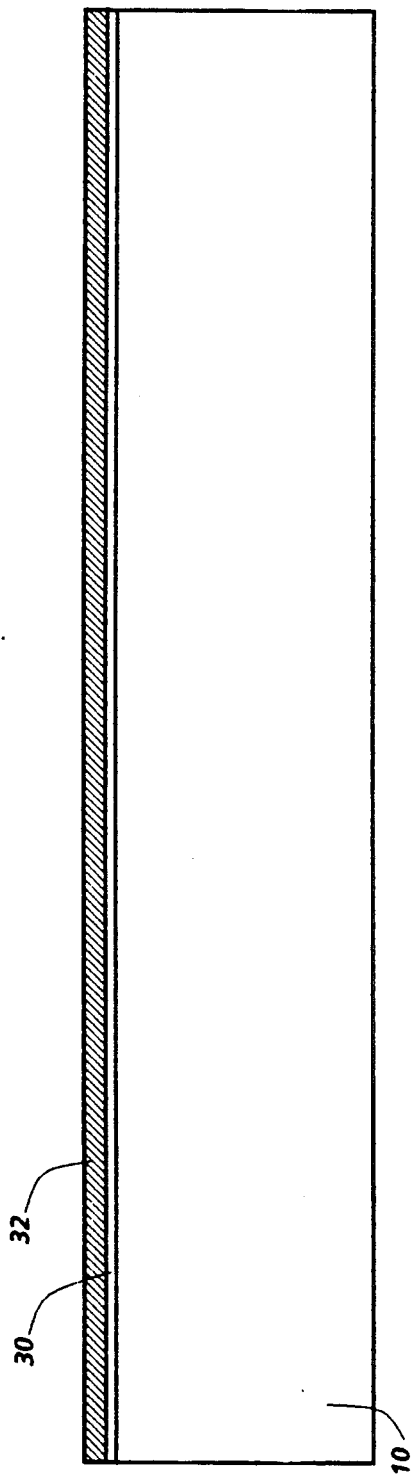
Figure 2B:
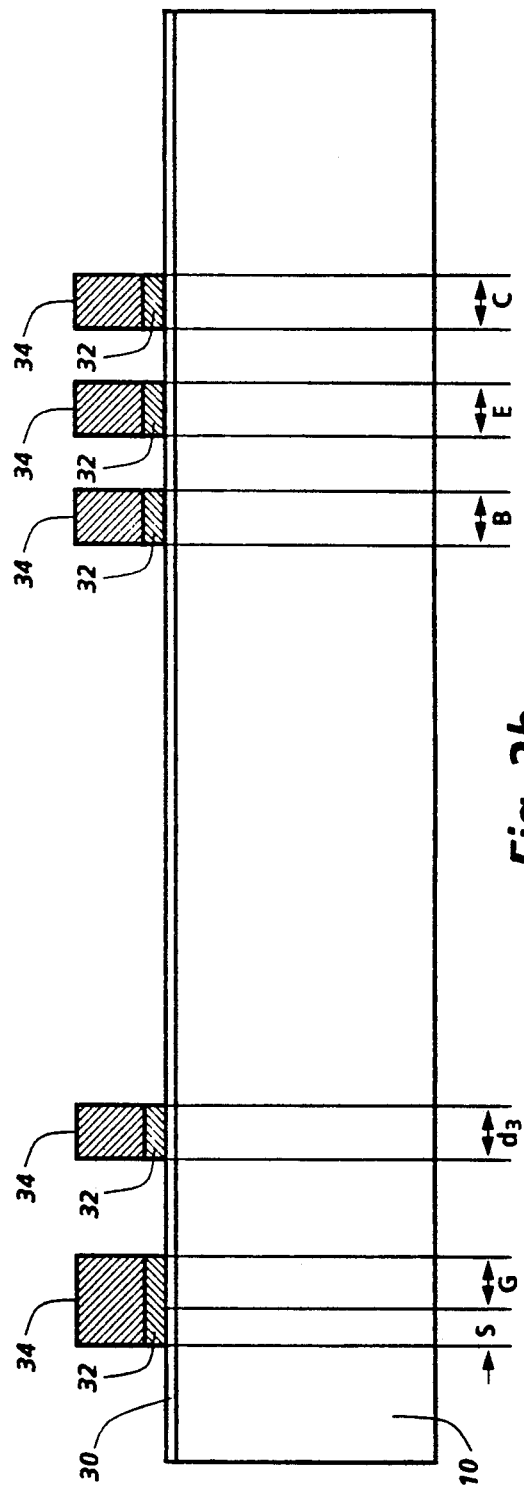
Figure 2E:
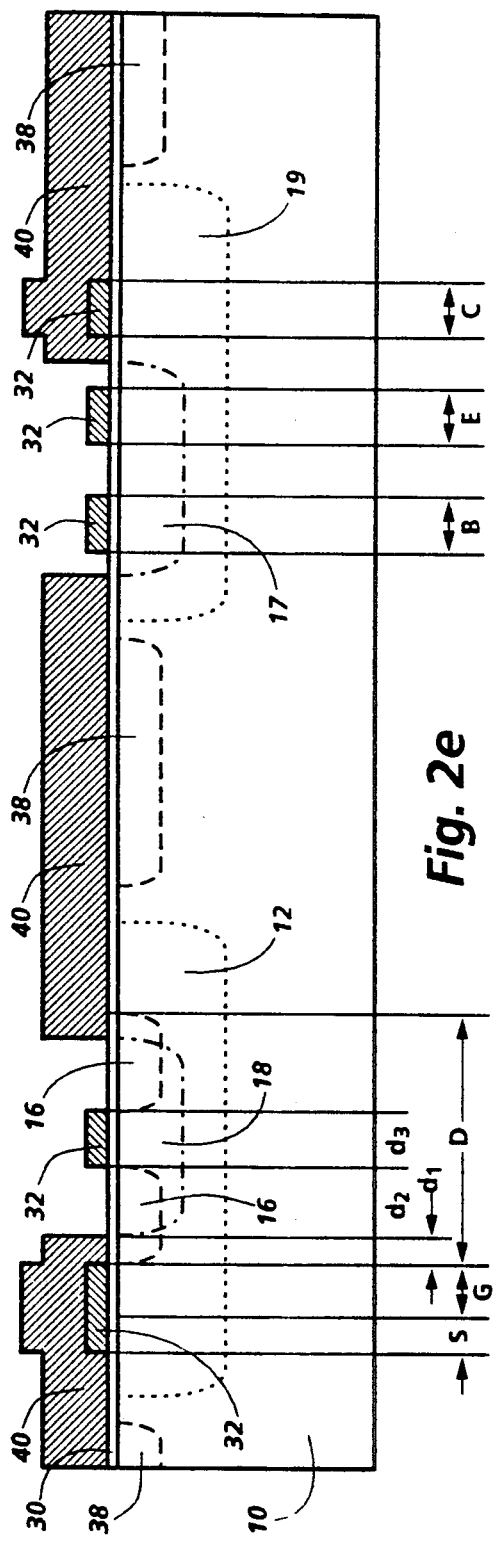
Figure 2F:
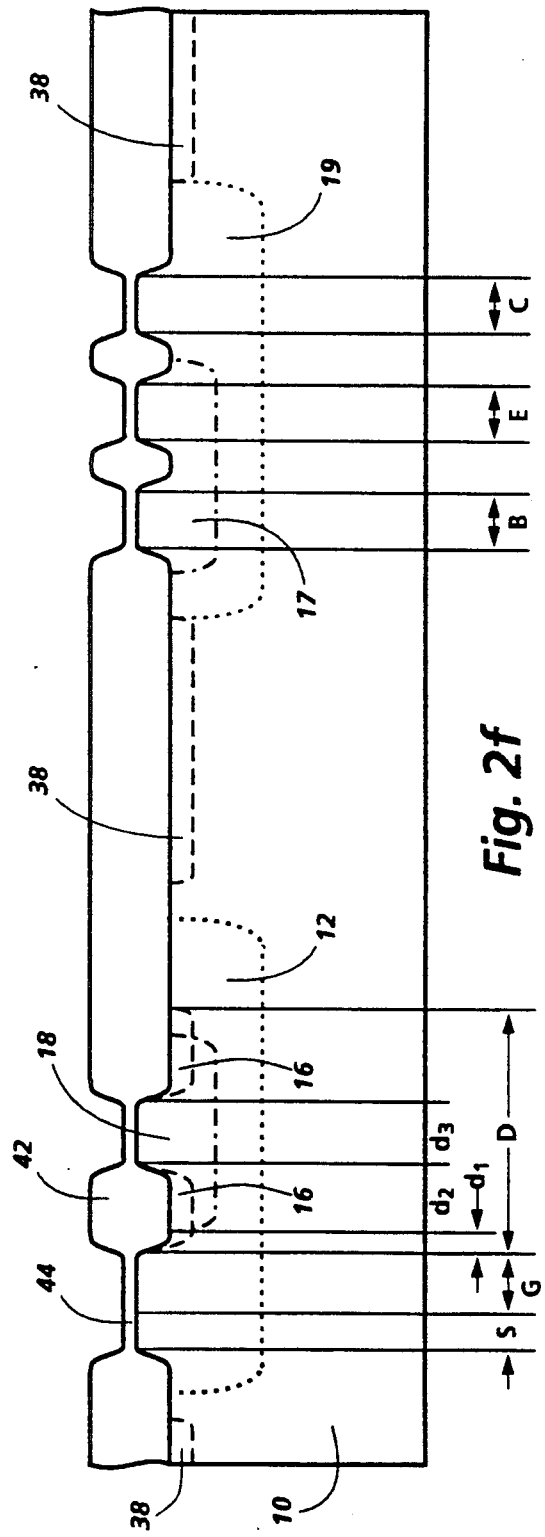
Figure 2I:
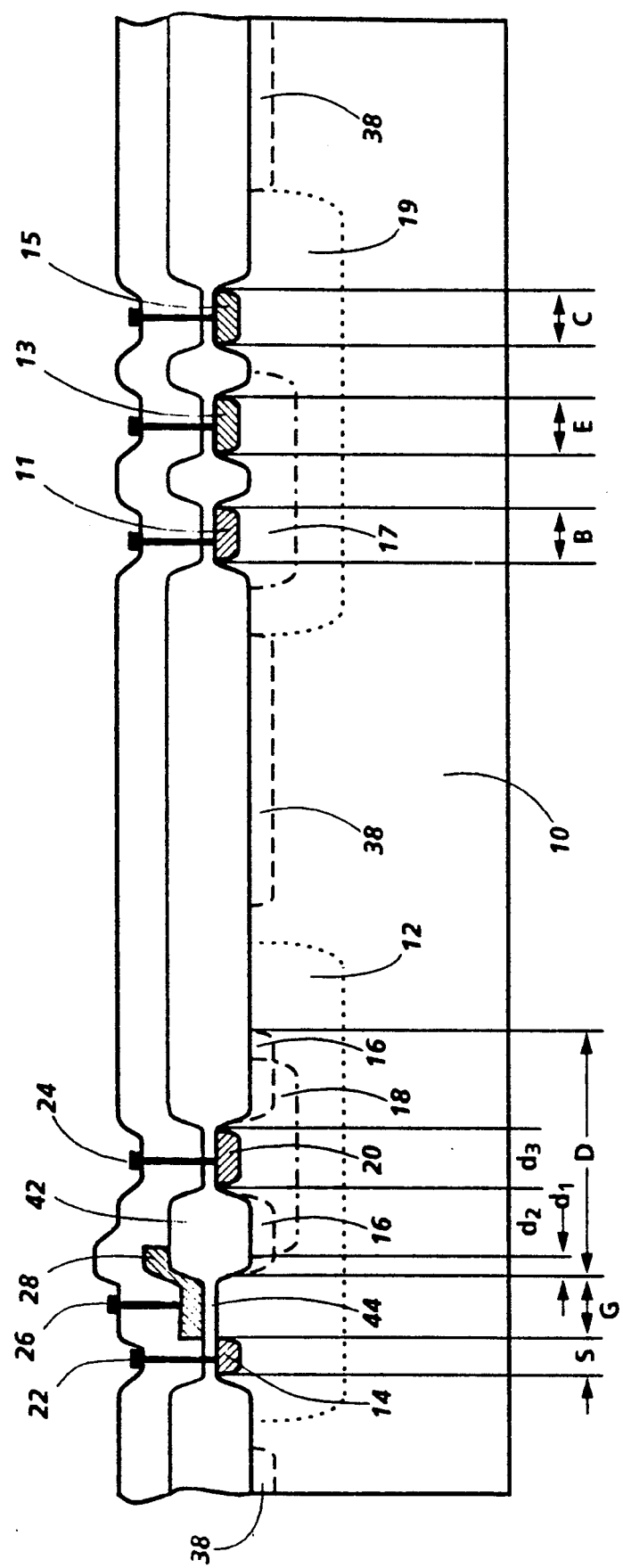
Figure 2J:
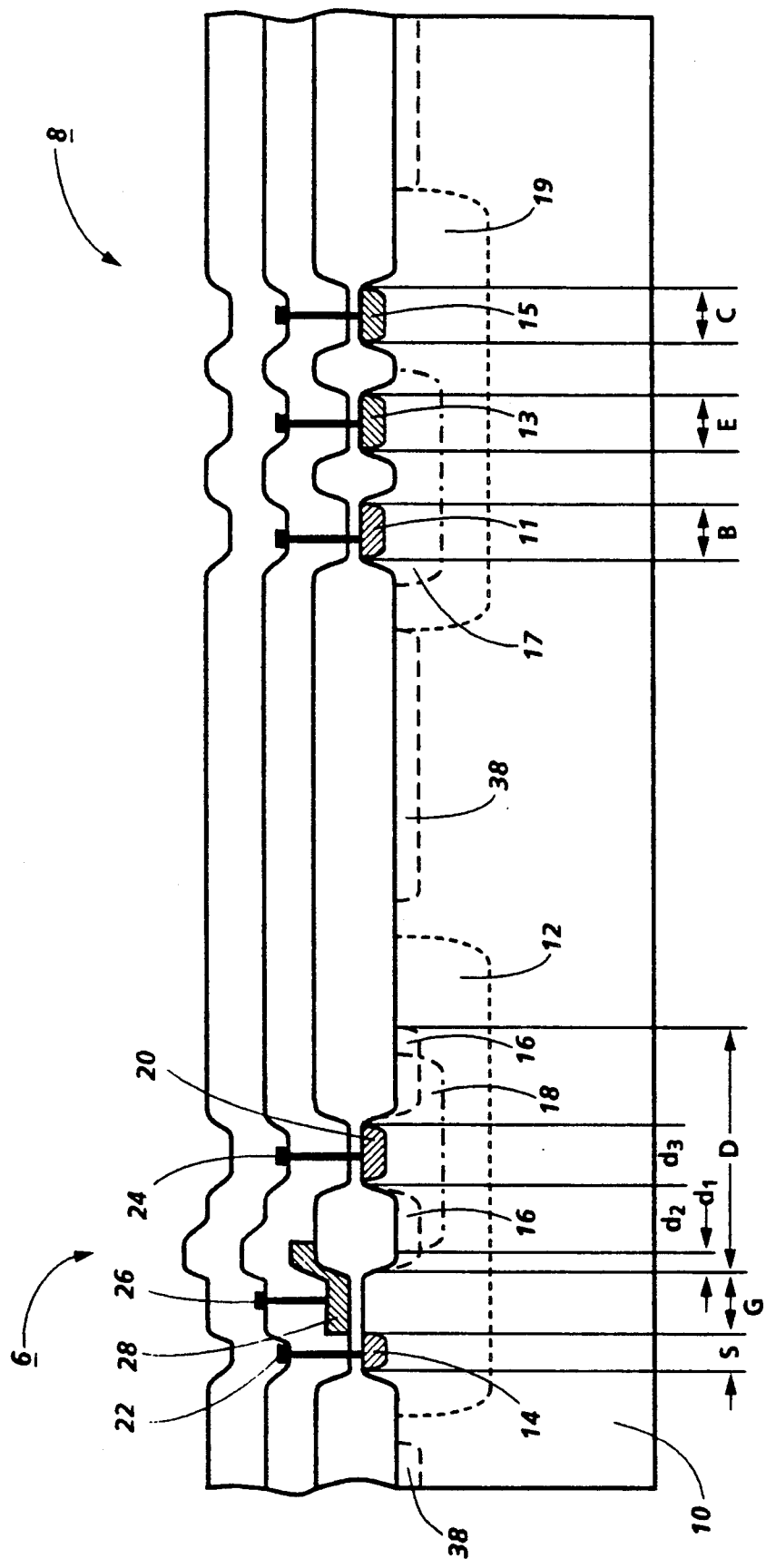

FIG. 2j shows an embodiment of a semiconductor device comprising a high voltage PMOS transistor 6 and an npn bipolar transistor 8 created according to the method of the incorporated Patent. All of the process steps for deposition of materials, etching and patterning are known in the art. The high voltage MOS transistor 6 comprises a p-type silicon substrate 10 having an n-well region 12. A source contact region 14 of the transistor is composed of a p+-type region within the n- well region 12. A drain region "D" comprises 3 different p-type regions 16,18,20. Region 16 is annular in shape and has a certain carrier concentration forming a first drift region. Region 18 overlaps the annular region 16 and has a carrier concentration which is greater than region 16 forming a second drift region. Region 20 is the drain contact region and has a carrier concentration which is greater than either drift regions 16 and 18 and is located adjacent to region 16. It is the relative concentrations of these regions 16,18, 20 which determine the breakdown characteristics of the high voltage MOS transistor 6. In between and adjacent to both the source contact region 14 and the drain region "D" is a gate region "G" which is n-type material. Traveling from the gate region "G" through the first drift region "d1", the second drift region "d2" to the drain contact region "d3", the carrier concentration rises. It is the lowest in the first drift region "d1" and the highest in the drain contact region "d3". Source electrodes 22 and drain electrodes 24 are provided and are made of metal and contact both the source contact region 14 and drain region "D" through the drain contact region 20. The gate region "G" contacts with a polysilicon gate layer 28 on the surface of the gate region "G" of the transistor. A bottom glass layer 27 is formed on the surface of the transistor structures. The bottom glass layer 27 insulates the transistors from metal interconnect lines. An insulative and protective layer of glass 29 resides on the surface of all the structures.

The bipolar transistor 8 comprises a heavily doped base contact region 11, an emitter region 13, and a collector region 15. A p-base region 17 is also present. The base contact region 11 and the emitter region 13 are formed within the p-base region 17. The p-base region 17 and the collector region 15 are contained within a n-well region 19. The operation and formation of bipolar transistors is well known in the art.

Referring now to FIGS. 2a through 2j, a CMOS sequence of process steps is described in greater detail, as well as the additional BiMOS steps that are required to manufacture the high voltage MOS transistor 6 and the npn bipolar transistor 8 on the same substrate. Thicknesses of the layers shown are not necessarily proportional.

In FIG. 2a there is shown the p-type silicon substrate 10 with an initial oxide layer 30 grown on substrate 10 and an initial nitride layer 32 deposited on the silicon oxide layer 30. The oxide layer is grown using conventional methods and may be from 200 Å to 500 Å thick. The nitride layer is deposited using conventional methods and may be from 800 Å to 1200 Å thick.

In FIG. 2b, using conventional patterning techniques, a photoresist layer 34 with a thickness of from 1.0 μm to 2.0 μm is formed. The nitride layer 32 shown in FIG. 2a is then etched to provide the nitride structure 32 shown in FIG. 2b. This remaining nitride layer 32 defines the regions that will eventually become the diffusion areas of the high voltage MOS transistor 6 and the bipolar transistor 8. The source contact region 14, drain contact region 20, base contact region 11, emitter region 13, and the collector region 15 have all been designated and will be formed underneath the remaining nitride layer 32 in subsequent steps.

Subsequently, as shown in FIG. 2c, n-wells 12, 19 are formed by use of the n-well mask forming a new photoresist pattern 36 and a subsequent n-well implant, these steps being performed in the conventional manner. A conventional high energy implant process utilizing a dosage from $1 \times 10^{12}$ atoms per square centimeter to $5 \times 10^{12}$ atoms per square centimeter with an energy level from 200 Kev to 300 Kev is used to penetrate the nitride/oxide pattern. Since the photoresist 36 is approximately ten times thicker than either nitride or oxide, the implant will not penetrate through the photoresist pattern but will penetrate the oxide 30 and nitride 32 not covered by the photoresist 36. The photoresist layer 36 is deposited according to conventional techniques.

In the next process step shown in FIG. 2d, boron field implant regions are made using the same conventional masking process steps and implantation process steps used in forming the n-well region 12. The boron field implants are implanted at a concentration of $5 \times 10^{12}$ atoms per square centimeter to $9 \times 10^{12}$ atoms per square centimeter and an energy of 20 Kev to 30 Kev. After drive-in, the concentration of boron will be between approximately $1 \times 10^{17}$ atoms per cubic centimeter to $5 \times 10^{17}$ atoms per cubic centimeter. The field implants will provide both the channel stop regions 38 and the first drift region contact 16 within the drain region "D" of the transistor. Since the implant is performed with a low energy, the nitride layer will block the field implant.

As described above, this normal CMOS process is modified by also allowing a circular p-field to be formed within the n-well, as shown in FIG. 1c, to create the high voltage pnp bipolar device.

Until now, this process has followed a conventional CMOS process pattern using only a conventional sequence of process steps. At this point this BiMOS process deviates from the conventional CMOS sequence. Using a photo resist pattern 40 and the conventional implanting techniques of the previous steps, a p-well implant region is made as is shown in FIG. 2e. The implant dosage is in the range of $5 \times 10^{12}$ atoms per square centimeter to $9 \times 10^{12}$ atoms per square centimeter and the implant energy is from 85 Kev to 110 Kev. After drive-in, the concentration of boron will be between approximately $3.5 \times 10^{17}$ atoms per cubic centimeter to $6.5 \times 10^{17}$ atoms per cubic centimeter. However, unlike conventional sequences, this process step will simultaneously make both the second drift region implant 18 of the high voltage MOS transistor and the base region 17 of the bipolar transistor 8. This enables the production of the high voltage MOS transistor 6 with bipolar transistors 8 without using the extra masks and implant steps that would be needed in a traditional process. These steps can be combined for any processes that seek to make both bipolar and high voltage MOS transistors on a single substrate. Since the implant is performed with a high energy, the nitride layer will not block the implant.

The completion of the transistor is shown in FIGS. 2f through 2j and follows well known and conventional CMOS process techniques.

In FIG. 2f, the remaining nitride layer 32 is etched away, and field oxides 42 and gate oxides 44 are grown. The field oxides are from 1000 Å to 9000 Å thick and the gates oxides are from 200 Å to 400 Å thick. Notice also, that some lateral diffusion of the channel stop region 38 occurs resulting in contact between the channel stop region 38 and n-well region 19.

Subsequently, the polysilicon gate 46 of the transistor is shown after formation in FIG. 2g. The steps of polysilicon deposition, definition of polysilicon areas with a new mask and photoresist pattern 48, and then poly etch of all areas not protected by photoresist 48 are performed. The polysilicon gate 46 has a thickness of from 3000 Å to 5000 Å.

Once again, the mask and photoresist pattern is changed to define the N+ implant areas that will become the emitter area 13 and the collector area 15 (see FIG. 2h) for the bipolar transistor and those areas are implanted with phosphorus at an implant level of $5 \times 10^{15}$ atoms per square centimeter to $5 \times 10^{16}$ atoms per square centimeter at an energy level of from 70 Kev to 80 Kev. Then the mask and photoresist pattern is changed to define the source contact 14 and drain contact 20 areas of high voltage transistor and the base area 11 of the npn bipolar transistor, and these areas are implanted with boron. The boron implantation is at a dosage of $1 \times 10^{15}$ atoms per square centimeter to $5 \times 10^{15}$ atoms per square centimeter and and energy level of from 55 Kev to 75 Kev. This implant step will create the p+ type source implant region 14 as well as the final p+ area in the drain contact region 20 and the base region 11 of the npn bipolar transistor as is shown in FIG. 2h.

The high voltage transistor has three concentration regions, "d1", "d2", "d3" within the drain region "D". Region "d1" is the first drift region and is the area where only the first drift region implant 16 has been implanted. The concentration of this region "d2" is between approximately $1 \times 10^{17}$ atoms per cubic centimeter to $5 \times 10^{17}$ atoms per cubic centimeter. Region "d2" is the second drift region and is located where the first drift region implant 16 and the second drift region implant 18 overlap. Because the concentrations are additive the resultant concentration is between approximately $4.5 \times 10^{17}$ atoms per cubic centimeter to $11.5 \times 10^{17}$ atoms per cubic centimeter. Region "d3" is the just finished drain contact region 20.

It is the now finished triple diffused "d1", "d2", "d3" drain region "D" that gives the transistor its special high voltage characteristics. Depending upon scalable device dimensions, this transistor operates within a voltage range of 50 volts to 200 volts, well above the normal operating range of conventional transistors of 5 volts. This drain region "D" is composed of three separate increasing implant concentration regions, first and second drift regions "d1", "d2", and the drain contact region "d3" that were made in the steps shown in FIGS. 2d, 2e, and 2h. In contrast to the conventional processes for making a high voltage transistor, the processing of the triple diffused drain high voltage transistor of the above described invention is effected by combining step sequences with other structures to be present on the semiconductor device, so that a transistor of increased complexity can be built without increasing the complexity of the processing sequence.

The remaining processes shown in FIGS. 2i through 2j for making contacts, metal lines, electrodes 22, 24, 26 passivation layers etc. are all done in a conventional manner to complete the integrated semiconductor device shown in FIG. 1g.

While the first and second drift region implants 16, 18 are shown as overlapped, it is possible to configure the photomasks differently to change the structure. Therefore, the first and second drift region implants 16, 18 might be adjacent to one another rather than overlapped.

Although the invention has been described as being fabricated on a p-type substrate, it is understood that there is an equivalent process where the transistors could be fabricated on a n-type substrate. In this equivalent process, boron would be implanted wherever phosphorus had been implanted and phosphorus would be implanted wherever boron had been implanted. This would result in an equivalent transistor where all n-type structures would now be p-type structures and all p-type structures would now be n-type structures.

Although the invention has been described with reference to particular means, methods, and embodiments, it is to be understood that the invention is not confined to the embodiment described in the foregoing and illustrated herein, but extends to all equivalents within the spirit and the scope of the claims.

We claim:

1. The method of forming a high voltage bipolar transistor comprising an n-well, a p+ emitter and an n+ base at the surface of a p-type silicon substrate and located within said well, and a p-field at the surface of said substrate circularly surrounding said emitter and separating said emitter from said base, comprising the steps of:

growing an oxide layer on the surface of said substrate, depositing a nitride layer on said oxide layer, using a first mask to etch away the nitride, to expose said oxide layer, except for two areas to form emitter and base nitride areas where the nitride remains, second masking to form an n-well exposed area overlapping and slightly larger than said emitter and base nitride areas, first implanting an n-well below said n-well area, third masking all of the surface of said substrate except for the area between said two nitride areas, second implanting in said area between said two nitride areas to form a p-field drift region to increase the breakdown voltage of the base to emitter junction, removing all of said nitride, fourth masking off all areas of said transistor except for said emitter area, third implanting to form a p+ emitter, fifth masking off all areas of said transistor except for said base area, and fourth implanting to form an n+ base.

2. The method of forming a high voltage bipolar transistor comprising a p- well, an n+ emitter and a p+ base at the surface of an n-type silicon substrate and located within said well, and an n-field at the surface of said substrate circularly surrounding said emitter and separating said emitter from said base, comprising the steps of:

growing an oxide layer on the surface of said substrate, depositing a nitride layer on said oxide layer, using a first mask to etch away the nitride, to expose said oxide layer, except for two areas to form emitter and base nitride areas where the nitride remains, second masking to form a p-well exposed area overlapping and slightly larger than said emitter and base nitride areas, first implanting a p-well below said p-well area, third masking all of the surface of said substrate except for the area between said two nitride areas, second implanting in said area between said two nitride areas to form an n-field drift region to increase the breakdown voltage of the base to emitter junction, removing all of said nitride, fourth masking off all areas of said transistor except for said emitter area, third implanting to form an n+ emitter, fifth masking off all areas of said transistor except for said base area, and fourth implanting to form a p+ base.

* * * * *